United States Patent
Satake et al.

(10) Patent No.: US 7,361,600 B2
(45) Date of Patent: Apr. 22, 2008

(54) SEMICONDUCTOR MANUFACTURING APPARATUS HAVING A BUILT-IN INSPECTION APPARATUS AND A DEVICE MANUFACTURING METHOD USING SAID MANUFACTURING APPARATUS

(75) Inventors: Tohru Satake, Kanagawa (JP); Nobuharu Noji, Kanagawa (JP)

(73) Assignee: Ebara Corporation, Tokyo (JP)

( * ) Notice: Subject to any disclaimer, the term of this patent is extended or adjusted under 35 U.S.C. 154(b) by 303 days.

(21) Appl. No.: 10/492,172

(22) PCT Filed: Nov. 1, 2002

(86) PCT No.: PCT/JP02/11450

§ 371 (c)(1),
(2), (4) Date: Apr. 9, 2004

(87) PCT Pub. No.: WO03/038858

PCT Pub. Date: May 8, 2003

(65) Prior Publication Data

US 2004/0248329 A1    Dec. 9, 2004

(30) Foreign Application Priority Data

Nov. 2, 2001    (JP)    ............... 2001-337602

(51) Int. Cl.
*H01L 21/302*    (2006.01)
*H01L 21/461*    (2006.01)
*C23F 1/00*    (2006.01)

(52) U.S. Cl. ............... 438/692; 438/689; 438/690; 438/691; 216/83; 216/84; 216/85; 216/88; 156/345.24; 156/345.31; 156/345.32

(58) Field of Classification Search ........... 156/345.31, 156/345.32; 118/718, 719; 414/939
See application file for complete search history.

(56) References Cited

U.S. PATENT DOCUMENTS 4,823,006 A    4/1989    Danilatos et al.

(Continued)

FOREIGN PATENT DOCUMENTS

EP    1 043 123 A2    10/2000

(Continued)

OTHER PUBLICATIONS

Claasen-Vujcic et al.; Solid State Technology, vol. 44, No. 4, pp. S06-S08-S10 and S12, Cowan Publ. Corp., Washington, US. Cited in the PCT search report.

(Continued)

*Primary Examiner*—Karla Moore
(74) *Attorney, Agent, or Firm*—Westerman, Hattori, Daniels & Adrian, L.L.P.

(57) ABSTRACT

According to the present invention, a chemical and mechanical polishing apparatus (100) for a sample such as a wafer includes a built-in inspection apparatus (25) incorporated therein. The polishing apparatus (100) further comprises a load unit (21), a chemical and mechanical polishing unit (22), a cleaning unit (23), a drying unit (24) and an unload unit (26). The chemical and mechanical polishing apparatus (100) receives a sample from a preceding step (107), carries out respective processes for the sample by said respective units disposed within the polishing apparatus (100) and then transfers the processed sample to a subsequent step (109). Sample loading and unloading means and a sample transfer means are no more necessary for transferring the sample between respective units.

9 Claims, 12 Drawing Sheets

U.S. PATENT DOCUMENTS

| | | | |
|---|---|---|---|
| 5,319,198 A | | 6/1994 | Wada |
| 5,664,987 A | | 9/1997 | Renteln |
| 5,827,110 A | | 10/1998 | Yajima et al. |
| 6,110,011 A | | 8/2000 | Somekh et al. |
| 6,117,780 A | * | 9/2000 | Tsai et al. ............... 438/692 |
| 6,165,050 A | * | 12/2000 | Ban et al. ............... 451/8 |
| 6,252,705 B1 | * | 6/2001 | Lo et al. ............... 359/393 |
| 6,281,962 B1 | | 8/2001 | Ogata et al. |
| 6,300,630 B1 | | 10/2001 | Veneklasen |
| 6,806,951 B2 | * | 10/2004 | Wack et al. ............ 356/237.2 |
| 2001/0012392 A1 | * | 8/2001 | Langley ............... 382/145 |
| 2002/0052116 A1 | * | 5/2002 | Vepa et al. ............... 438/692 |

FOREIGN PATENT DOCUMENTS

| | | |
|---|---|---|
| JP | 10-116872 A | 5/1998 |
| JP | 11-64467 A | 3/1999 |
| JP | 11-67134 A | 3/1999 |
| WO | WO 95/26041 A1 | 9/1995 |
| WO | WO 9925004 A1 * | 5/1999 |

OTHER PUBLICATIONS

Claasen-Vujcic et al.; Solid State Technology, vol. 44, No. 4, pp. S06-S08-S10 and S12, Cowan Publ. Corp., Washington, US. Cited in the PCT search report, Apr. 2001.

Search Report dated May 21, 2007 issued in corresponding European Application No. 06019773.8-1528.

Toshihiro Furuya et al., "Evaluation Equipment for Semiconductor Process Using an Electron Beam" Dec. 1, 1991, Hitachi Review, Hitachi Ltd. Tokyo, JP pp. 389-394, XP000306348 ISSN: 0018-277X.

* cited by examiner

SEMICONDUCTOR MANUFACTURING APPARATUS HAVING A BUILT-IN INSPECTION APPARATUS AND A DEVICE MANUFACTURING METHOD USING SAID MANUFACTURING APPARATUS

FIELD OF THE INVENTION

The present invention relates to an apparatus for carrying out a series of semiconductor processing steps for a sample such as a wafer, including lithography, film deposition (CVD, sputtering or plating), oxidation, impurity doping, etching, planarization, cleaning and drying, while carrying out a profile observation and/or a defect inspection of a high density pattern on the sample such as the wafer after having finished with said series of processing steps with high precision and high reliability. The present invention further relates to a semiconductor device manufacturing method in which a pattern inspection is carried out in the course of the device manufacturing process by using the apparatus described above.

DESCRIPTION OF THE PRIOR ART

In a practice according to the prior art technology, a profile observation apparatus or a defect inspection apparatus has been fabricated as two separately independent units (stand-alone units) and also separately located in a manufacturing line. Owing to this arrangement, a sample such as a wafer, after having finished with a certain step of semiconductor processing, has been required to be accommodated in a cassette and then transferred by some transfer means from one unit of semiconductor manufacturing apparatus to the other unit of inspection apparatus either directly or via a cleaning and a drying units.

SUMMARY OF THE INVENTION

In such a layout of respective units arranged as specified above, sample transfer means are required therebetween, and also each unit requires a loader means and an unloader means for setting/taking the sample into/out of the cassette. This inevitably needs an enlarged area available for installing the entire apparatus, disadvantageously increasing total cost of the apparatus and leading to a higher probability of contamination on a sample such as a wafer.

The present invention has been made to solve the problems described above, and an object thereof is to provide an apparatus and a method for manufacturing a semiconductor, in which an area required for installing the apparatus may be reduced by eliminating the transfer means between respective units and instead sharing the loader and the unloader means among respective units, thereby reducing the total cost of the apparatus as well as the probability of the contaminated samples, and increasing an yield of processing.

To solve the problems as stated above, according to the present invention, there is provided a semiconductor manufacturing apparatus for a sample such as a wafer, said apparatus characterized in having a defect inspection apparatus built therein. According to this invention, since the semiconductor manufacturing apparatus has the built-in inspection apparatus incorporated therein, therefore a sample such as a wafer, which has been taken in by a loading section, can be transferred to the defect inspection apparatus within said apparatus after one step of manufacturing process having been finished and then taken out of an unloading section after the completion of the inspection by the defect inspection apparatus. Accordingly, the present invention can reduce the number of required sets of loading and unloading sections to only one pair of sets, which otherwise would have been required by the number corresponding to that of respective units. Further, according to the present invention, the sample transfer unit for transferring the sample such as the wafer between the semiconductor manufacturing apparatus and the defect inspection apparatus could also be omitted. Accordingly, this can reduce a floor area required for the installation of the apparatus as well as the total cost of the apparatus and also improve the yield of processing by a reduced probability of contamination occurring on the sample such as the wafer, and a feed-back operation of a result of defect inspection to the semiconductor manufacturing apparatus.

The defect inspection apparatus as discussed above may be a defect inspection unit using an energy particle beam and said defect inspection unit may be integrated with said semiconductor manufacturing apparatus to form a single unit. The concept of the energy particle beam or the energy beam covers an electron beam, an X-ray, an X-ray laser, an ultraviolet ray, an ultraviolet lay laser, a photoelectron and a light. Besides, the defect inspection apparatus using said energy particle beam or the energy beam comprises at least an energy particle irradiating section, an energy particle detecting section, an information processing section, an X-Y stage and a sample carrier table.

The semiconductor manufacturing apparatus may be built to include a CMP (Chemical and Mechanical Polishing) section, a cleaning section, a drying section, an inspecting section having said inspection unit and a loading section as well as an unloading section. Further, the inspecting section may be disposed in the vicinity of either one or either two or three of the CMP section, the drying section and the unloading section. According to the feature of this aspect, the area required for the installation of the entire apparatus can be reduced, and four functions consisting of the planarizing process, the cleaning, the drying and the inspection can be carried out by this single unit of apparatus, and further advantageously, the physical relations among the main components disposed proximal to one another can increase the efficiency and further decrease the floor area required for the installation.

Alternatively, the semiconductor manufacturing apparatus may be built to include a plating section, a cleaning section, a drying section, an inspecting section having said defect inspection unit and a loading section as well as an unloading section. Further, the inspecting section may be disposed in the vicinity of either one or either two or three of the plating section, the drying section and the unloading section. According to the feature of this aspect, the same effect as that in said CMP case could be obtained with this plating unit.

In the semiconductor manufacturing apparatus as discussed above, the defect inspection apparatus may be an electron beam inspection apparatus, and a cleaning unit and a drying unit may be incorporated in said semiconductor manufacturing apparatus. According to the feature of this aspect, an inspection with higher resolution can be applied to a sample such as a wafer in the defect inspection apparatus, which allows to inspect such an electrical defect as a break or a bad conduction in a via or a wiring. Further, since the incorporation of the cleaning unit and the drying unit in the apparatus as a single unit can eliminate the loading and the unloading sections as well as the sample transfer unit associated with the cleaning and drying units which have been conventionally arranged as the independent standalone units, therefore the floor area required for installing the apparatus and also the total cost of the apparatus can be reduced and further the yield of the processing can be improved by the reduced probability of contamination occurring on the sample such as the wafer and the feed-back operation of the result of defect inspection to said semiconductor manufacturing apparatus.

The electron beam defect inspection apparatus may comprise a differential pumping system. According to the feature of this aspect, there would be no need for vacuum evacuation in a space around the sample stage of the electron beam apparatus, and the sample such as the wafer can be transferred without a load lock mechanism in front and rear of the stage space.

Further, the electron beam irradiated region on a surface of the sample may be evacuated by using the differential pumping system. According to the feature of this aspect, the electron beam irradiated region defined on the surface of the sample is exclusively evacuated, thereby facilitating a more efficient evacuation system to be constructed.

The defect inspection apparatus may be an electron beam defect inspection unit of the scanning electron microscope (SEM) system. In this case, a primary electron beam used in the electron beam defect inspection unit may be composed of a plurality of electron beams and secondary electrons from the sample may be deflected from an optical axis of the primary electron beam by an E×B filter (Wien filter) so as to be detected by a plurality of electron beam detectors.

Alternatively, the defect inspection apparatus may be an electron beam defect inspection unit of the map projection type electron microscope system. In this case, a primary electron beam used in the electron beam defect inspection unit may be composed of a plurality of electron beams and said plurality of electron beams are irradiated against the sample while scanning the sample, wherein secondary electrons from the sample may be separated from an optical axis of the primary electron beam by an E×B filter (Wien filter) so as to be detected by a two-dimensional or a line image sensor. According to the feature of this aspect, the dose of electrons as well as the resolution of the secondary optical system and thus the throughput can be improved.

According to the present invention, a semiconductor device manufacturing method is also provided, which uses any one of the semiconductor manufacturing apparatuses as discussed above so as to inspect a wafer in the course of processing. Using said semiconductor device manufacturing apparatus may help improve the yield of processing significantly.

BRIEF DESCRIPTION OF THE DRAWINGS

The present invention will now be described in detail with reference to the attached drawings illustrating some preferred embodiments of the present invention, in which.

DESCRIPTION OF THE BEST MODE FOR
CARRYING OUT THE PRESENT INVENTION

Figure 1:
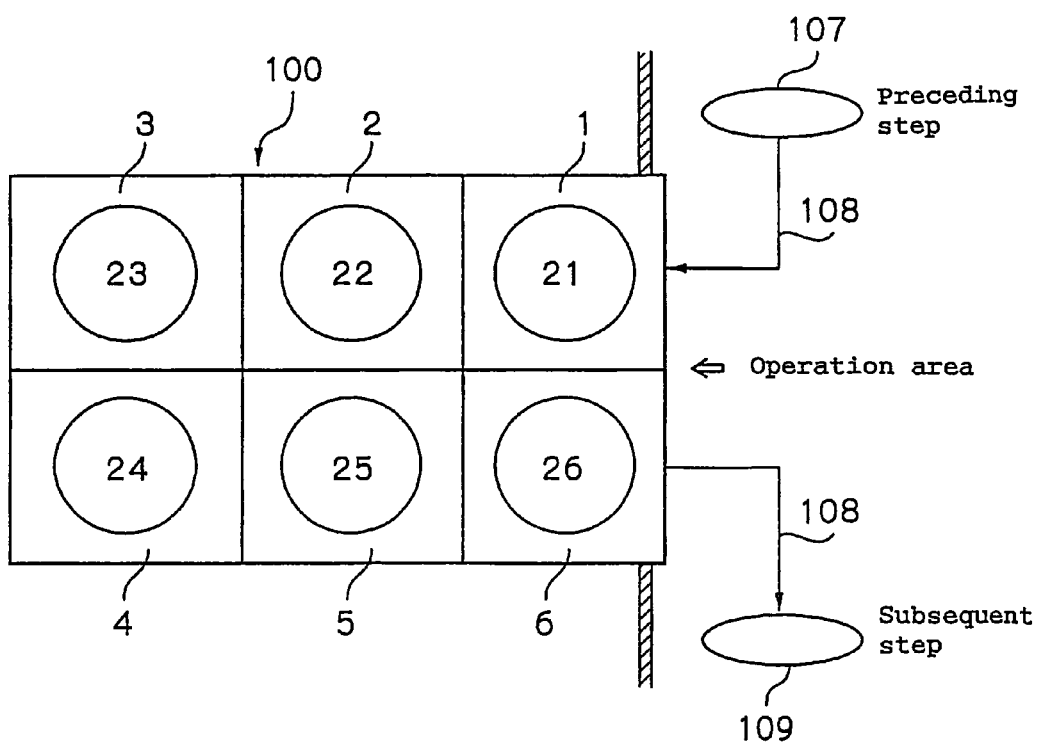
FIG. 1 is a schematic diagram illustrating a principle of the present invention.

FIG. 1 is a schematic diagram illustrating a configuration of a chemical mechanical polishing (CMP) unit 100 having a built-in inspection apparatus by way of an example of a semiconductor manufacturing apparatus of the present invention. Main components as designated herein are specifically a loading section 1 equipped with a load unit 21, a CMP section 2 equipped with a CMP unit 22, a cleaning section 3 equipped with a cleaning unit 23, a drying section 4 equipped with a drying unit 24, an inspecting section 5 equipped with an inspection unit 25 and an unloading section 6 equipped with an unload unit 26, all of which are arranged functionally and collectively constitute an integrated single unit of apparatus. That is, FIG. 1 shows one example of the present invention, in which respective sections are disposed so as to carry out their functions efficiently. In addition, a transfer mechanism and/or a positioning mechanism for a wafer are disposed at appropriate locations, though not shown in the drawing. Also not illustrated in the drawing, but the loading section 1 and the unloading section 6 are provided with a mini-environment mechanism (a mechanism for circulating an air or a gas such as nitrogen, which has been cleaned by a cleaning apparatus, in a form of down flow so as to prevent contamination of a sample such as a wafer), respectively. The mechanism such as the sample transfer mechanism comprises a vacuum chuck mechanism, an electrostatic chuck mechanism or a mechanical sample clamping mechanism, which would be typically required to secure the sample rigidly, but such mechanism is omitted in the drawing. Said loading section 1 and said unloading section 6 have no need to be arranged independently but may be replaced with a single room equipped with a single transfer unit. Generally, said loading section 1, said unloading section 6 and a control panel (not shown) are preferably disposed in such an orientation that permits an access (operation) from one direction, as shown in FIG. 1, thus implementing the through-the-wall system (i.e., the system in which a mechanism for taking in/out a sample and a control section are exclusively installed in a chamber having a higher level of cleanliness, while a main body of an apparatus which is likely to generate dusts is installed in a location having a lower level of cleanliness, with a partitioning wall defining an interface therebetween, so that the load in the chamber having the higher level of cleanliness can be reduced). Further, a yield of the CMP process can be improved by feeding-back a result of the defect inspection to the CMP section 2.

Figure 2:
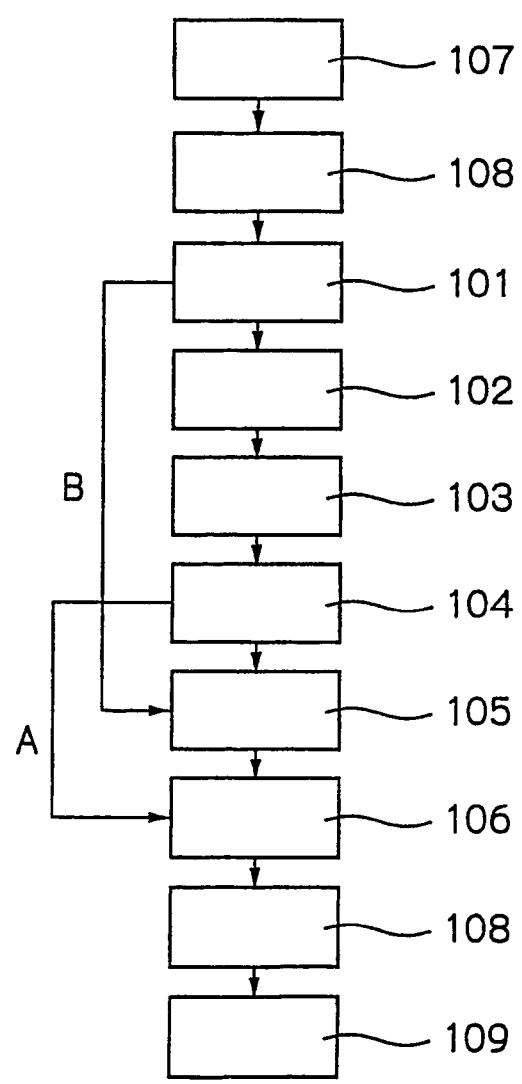
FIG. 2 is a flow diagram illustrating exemplary processing steps according to the present invention.

FIG. 2 shows an example of processing steps according to the present invention. A sample such as a wafer, usually accommodated in a cassette, is transferred from a prior processing step 107 through a sample transfer step 108, in which the sample is taken out of the cassette in the loading section 1 and inserted into the CMP section 2 (a sample loading step 101), and after having been subjected to a planarizing processing in the CMP section 2 (a CMP step 102), the sample subsequently passes through a cleaning step 103 in the cleaning section 3 and a drying step 104 in the drying section 4 into the inspecting section 5. The inspecting section 5 carries out a profile inspection and/or a defect inspection (an inspecting step 105), and the sample is further moved into the cassette in the unloading section 6 (a sample unloading step 106), and thereafter in the sample transfer step 108, the sample is transferred to a subsequent processing step 109, for example, to an exposing step, as it is accommodated in the cassette.

In the flow diagram of the processing steps shown in FIG. 2, such a sample having no need to pass through the inspection process 105 may skip the inspecting step 105 but may be transferred directly to the unloading section 106 after the cleaning and the drying steps, as designated by the line "A". Also similarly, the CMP process 102, the cleaning process 103 and the drying process 104 may be bypassed, as designated by the line "B".

In the system according to the prior art (illustrated in FIG. 3), the CMP planarizing process, the cleaning and drying process and the inspecting process have been carried out independently by separated (stand-alone) CMP unit 11, cleaning and drying unit 12 and inspection unit 13 (shown in FIG. 3), respectively. Those units have been equipped with the loading sections 1 and the unloading sections 6, respectively, meaning that the total of three sets of the loading and the unloading sections have been provided in the configuration of the prior art. Besides, those units 108 for transferring the sample should have been also provided between respective units.

Figure 4:
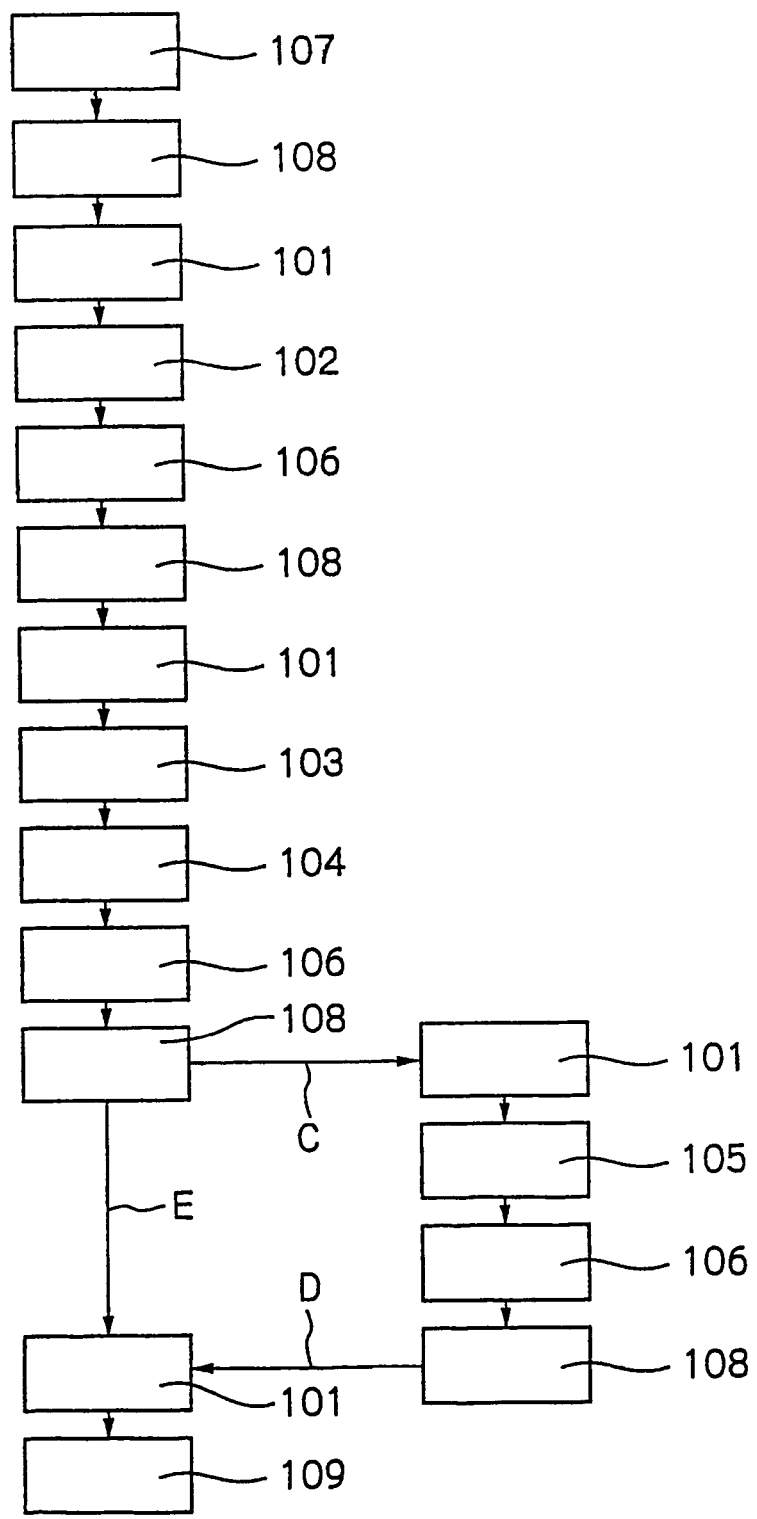
FIG. 4 is a flow diagram illustrating exemplary processing steps according to the prior art method.

FIG. 4 shows a wafer processing steps according to the prior art. A sample such as a wafer, usually accommodated in a cassette, is transferred from a prior processing step 107 through a sample transfer step 108, in which the sample passes through a loading section 1 and is inserted into a CMP section 2 (a sample loading step 101), and after having been subjected to a planarizing processing in the CMP section (a CMP step 102), the sample subsequently passes through a sample unloading step 106, a sample transfer step 108 and a sample loading step 101 and further through a cleaning step 103 and a drying step 104, then through the sample unloading step 106 and the sample transfer step 108 into an inspection apparatus 13 (line "C"). The sample passes through the loading section 1 (the loading step 101), and the inspecting section 13 carries out a profile inspection and/or a defect inspection on the sample (an inspecting step 105). Thereafter, the sample is moved into the cassette in the unloading section 6 of the inspection apparatus 13 (the sample unloading process 106), and then the sample is transferred to a subsequent processing step 109, for example, an exposing process, as it is accommodated in the cassette (line "D"). Since the inspecting process typically takes longer time, therefore the inspection is not applied to every single wafer after having finished with the CMP, the cleaning and drying processes but a sampling inspection should be carried out. That is, such wafers by-passing the inspection may follow the line designated as "E" shown in FIG. 4.

Figure 3:
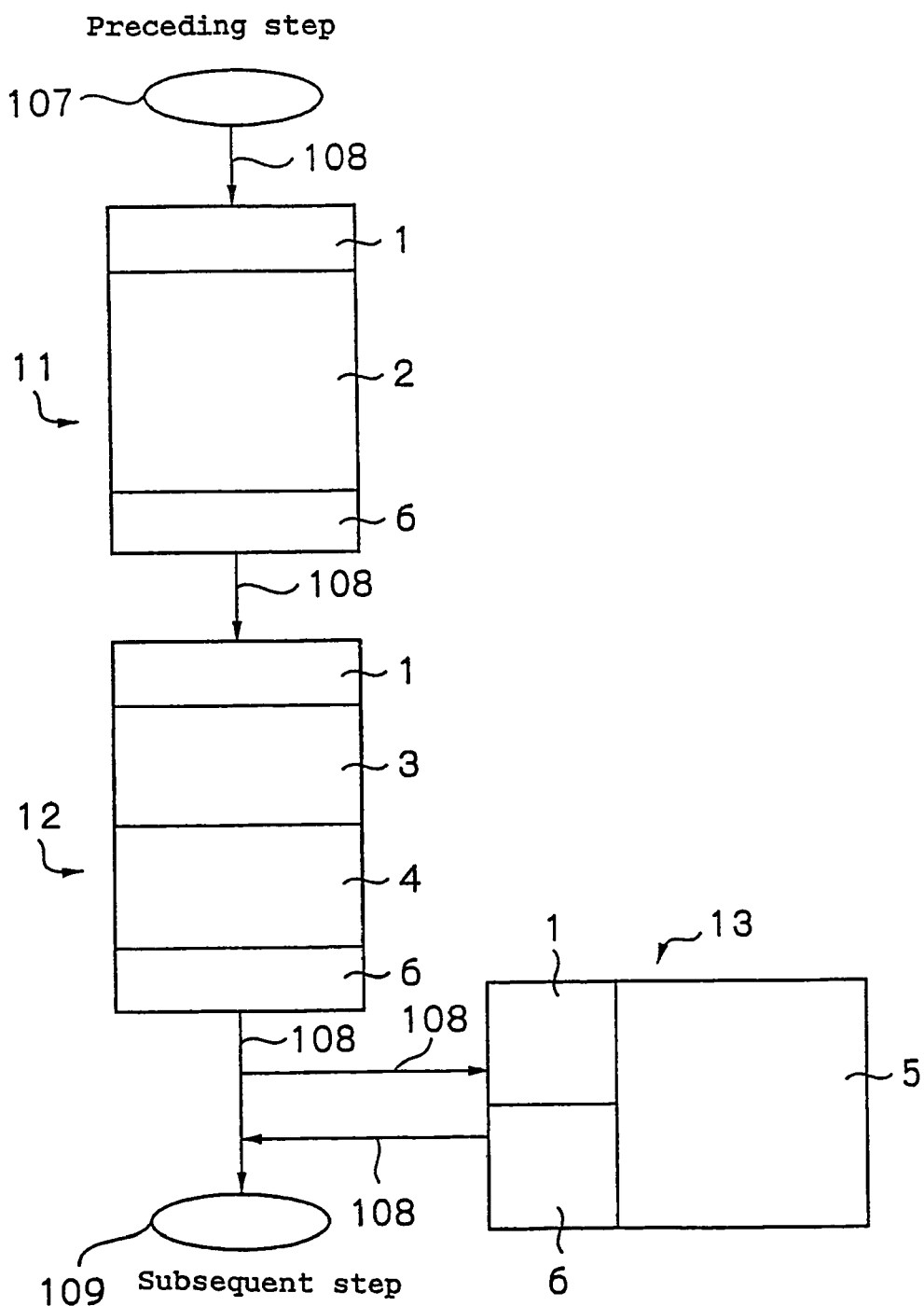
FIG. 3 is a schematic diagram illustrating a prior art method.

As can be seen obviously from the comparison of FIG. 2 to FIG. 4, the number of the processing steps according to the present invention could be reduced to ⅔ as compared to that of the prior art, thus correspondingly shortening the required time by 10% and reducing the area required for installation of the apparatus by 20%. Further, the present invention has successfully reduced the cost of manufacturing the apparatus by 15%.

The CMP unit having the built-in defect inspection apparatus has been described above as an example of the semiconductor manufacturing apparatus according to the present invention, and it should be appreciated that other semiconductor manufacturing apparatuses for carrying out other types of processing, including lithography, film deposition (CVD, sputtering or plating), oxidation, impurity doping and etching, may be similarly configured so as to include the built-in defect inspection apparatus.

Figure 5:
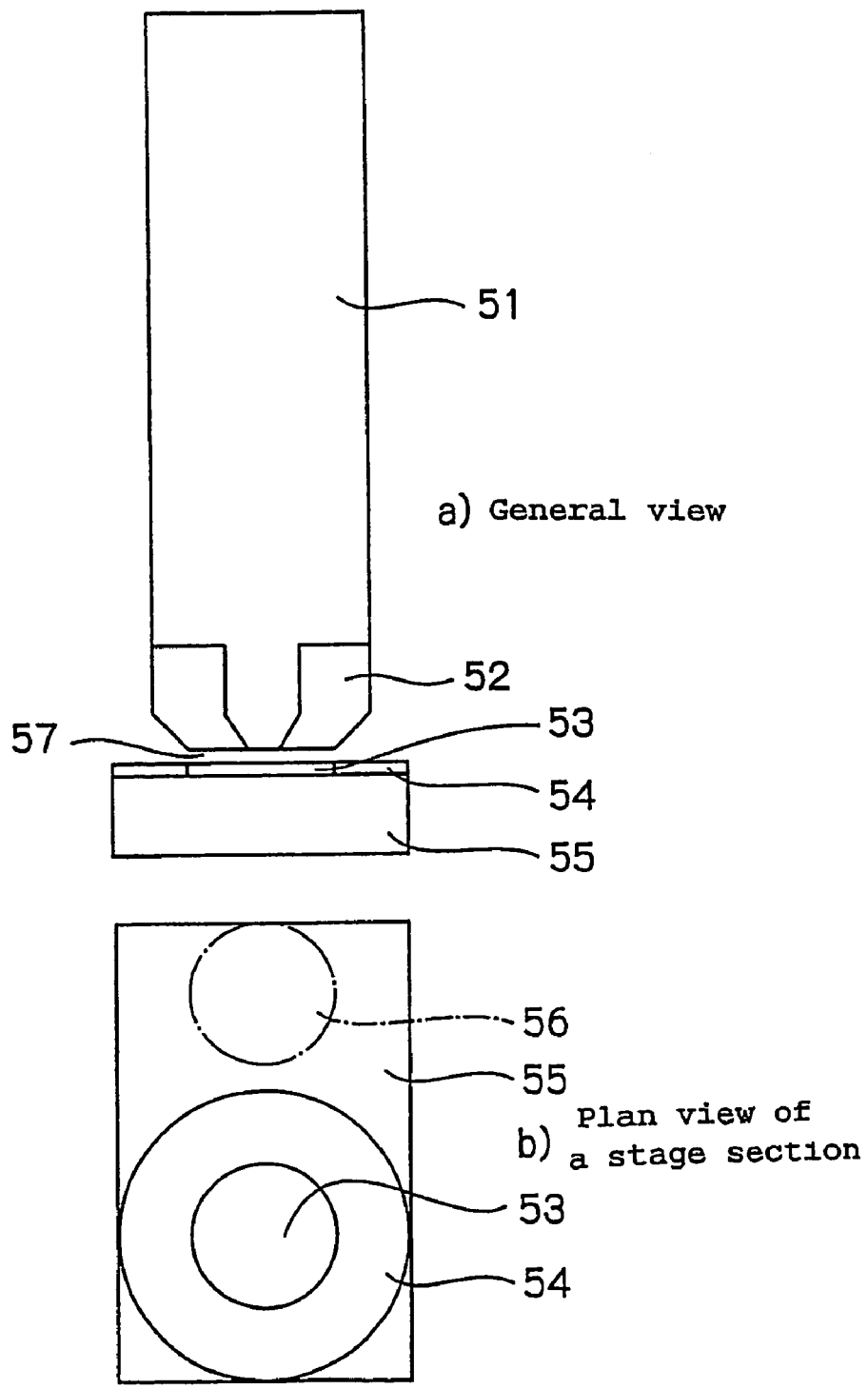
FIG. 5 is a schematic diagram showing a second embodiment of the present invention.

FIG. 5 is a schematic diagram illustrating a defect inspection unit of the electron beam type comprising a differential pumping mechanism, which is to be included in a semiconductor manufacturing apparatus according to a second embodiment of the present invention. In this drawing, only main components represented by a lens barrel 51 of the electron beam defect inspection unit, a differential pumping section 52, a guard ring 54 and a moving stage 55 are shown but other components such as a control system, a power supply system and an evacuation system are omitted. A wafer 53 prepared as a sample is fixedly mounted on the moving stage 55 with the guard ring 54 surrounding the periphery thereof. The guard ring 54 has the same height (thickness) as the wafer 53 by taking into consideration that a small gap 57 between the top end of the differential pumping section 52 and the wafer 53 and guard ring 54 should be kept constant even during the stage being moved. The rest of the area on the moving stage 55 other than the area occupied by the guard ring 54 and the wafer 53 is also flush with the wafer 53.

Loading/unloading operation of the wafer 53 is performed at a location in which the center of a wafer exchange position 56 on the stage 55 matches with the center of the inspection unit. The unloading operation of the wafer is carried out according to the following procedure, in which firstly the wafer is lifted up by three pins of the moving stage 55, which are capable of moving up and down; secondly a hand of a transfer robot is inserted under the wafer 53 from the side; and then the robot's hand is lifted up to catch the wafer and then to transfer the same. The loading operation of the wafer is carried out according to the procedure in which the processes are taken in an inverse sequence of those of the unloading operation.

Figure 6:
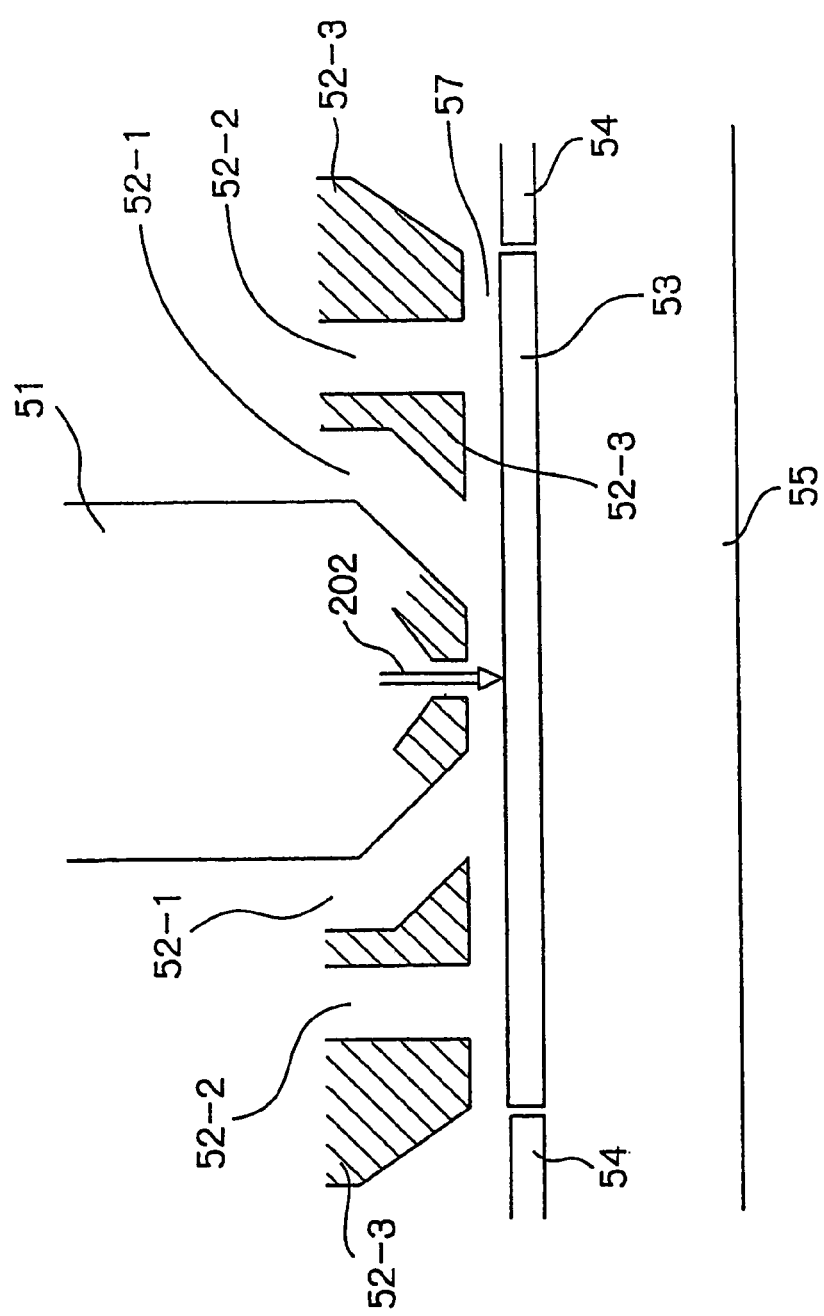
FIG. 6 is a schematic view illustrating a differential pumping section.

FIG. 6 is a schematic diagram illustrating the differential pumping section 52 of FIG. 5. A differential pumping body (52-3) of the differential pumping section 52 is provided with an pumping slot I (52-1) and an pumping slot II (52-2) arranged concentrically, wherein the exhaust slot I is evacuated by a wide-range turbo-molecular pump, while the pumping slot II is evacuated by a dry pump. An exit port for an electron beam 202 (which works also as an entry port for secondary electrons) forms a hole-like shape of $\phi 1$ mm having a length of 1 mm so as to reduce a conductance. The small gap 57 may be maintained to be typically not greater than 0.5 mm (preferably not greater than 0.1 mm) by controlling the height of the stage 55. This differential pumping section was evacuated by connecting it with the dry pump having a pumping speed of 1000 litter/min and the turbo-molecular pump having the pumping speed of 1000 litter/s, and the result shows that a pressure of $10^{-3}$ Pa order in the electron beam irradiating section and a pressure of $10^{-4}$ Pa order in the vicinity of the electron beam exit in the lens barrel were obtained, respectively.

Figure 7:
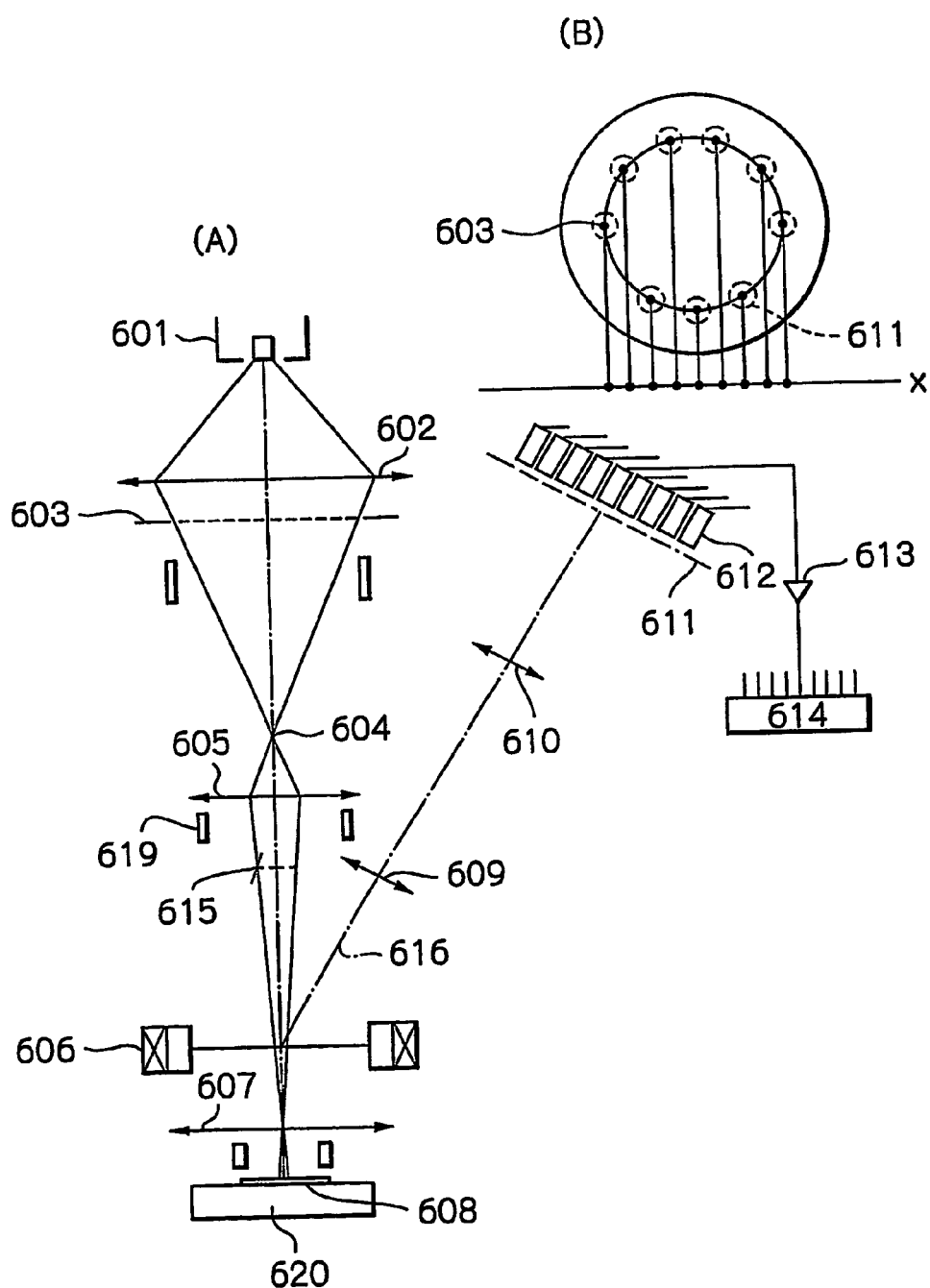
FIG. 7 is a schematic diagram showing a third embodiment of the present invention.

FIG. 7 (A) is a schematic diagram showing an optical system of a sample evaluation apparatus using an electron beam according to a third embodiment of the present invention. In FIG. 7, the electron beam emitted from an electron gun 601 is focused by a condenser lens 602 to form a crossover at a point 604.

A first multi-aperture plate 603 having a plurality of apertures is disposed below the condenser lens 602 and this multi-aperture plate 603 forms a plurality of primary electron beams. Thus formed plurality of primary electron beams is demagnified respectively by a demagnifying lens 605 and projected onto a point 615. Then, after having been focused at the point 615, the electron beams are further focused by an objective lens 607 onto a wafer 608 prepared as a sample. The plurality of primary electron beams exited from the first multi-aperture plate 603 is simultaneously deflected by a deflector 619 located between the demagnifying lens 605 and the objective lens 607 so as to scan a surface of the wafer 608. It is to be noted that reference numeral 620 designates an X-Y stage movable on the x-y plane with the wafer 608 loaded thereon.

In order to prevent an image field curvature aberration from being generated by the demagnifying lens 605 and the objective lens 607, the first multi-aperture plate 603 includes a plurality of small apertures located along a circle in such an arrangement that the spots projected on the x-axis are equally spaced, as shown in FIG. 7 (B).

A plurality of spots on the wafer 608 are irradiated by the plurality of focused primary electron beams, and secondary electron beams emanated from said plurality of irradiated spots are attracted by an electric field of the objective lens 607 so as to get narrower and then are deflected by an ExB separator 606 to be finally introduced into a secondary optical system. An image formed by the secondary electron beams is focused on a point 616 closer to the objective lens 607 rather than the point 615. This is because each of the primary electron beams has energy of 500 eV on the surface of the wafer 608, while the secondary electron beam only has the energy of some eV.

The secondary optical system has magnifying lenses 609, 610, and the secondary electron beams after having passed through those magnifying lenses are formed into an image on a second multi-aperture plate 611. The secondary electron beams then pass through a plurality of apertures of the second multi-aperture plate and then are detected by a plurality of detectors 612. It should be appreciated that the plurality of apertures of the second multi-aperture plate 611 located in front of the detectors 612 corresponds to the plurality of apertures of the first multi-aperture plate 603 on one-to-one basis, as shown in FIG. 7(B).

Each of the detectors 612 converts the received secondary electron beam to an electric signal representing an intensity thereof. The electric signal from each of the detectors 612 is amplified by an amplifier 613 and then converted into an image data in an image processing unit 614. The image processing unit 614 is also supplied with a scanning signal for deflecting the primary electron beam from the deflector 619, with which the image processing unit 614 can obtain the image data representing the image of the surface of the wafer 608. Any defects can be detected by comparing the obtained image data to a reference pattern, and further a line width evaluation signal may be extracted by moving the pattern to be evaluated on the wafer 608 to the vicinity of the optical axis of the primary optical system through the registration so as to apply a line scanning thereto, so that the line width of the pattern on the wafer 608 can be measured by appropriately calibrating the obtained line width evaluation signal.

It is to be noted that when the primary electron beams after having passed through the apertures of the first multi-aperture plate 603 are focused on the surface of the wafer 608 and the secondary electron beams emanated from the wafer 608 are formed into an image on the detector 612, the care must be taken in order to minimize the affection by the three aberrations, i.e., the distortion caused by the primary optical system, the image field curvature, and the astigmatism in the field of view.

Further, if a minimum value for the space between respective points irradiated by the plurality of primary electron beams is determined to be greater than the aberration of the secondary optical system, then the cross-talk among a plurality of beams can be eliminated.

Figure 8:
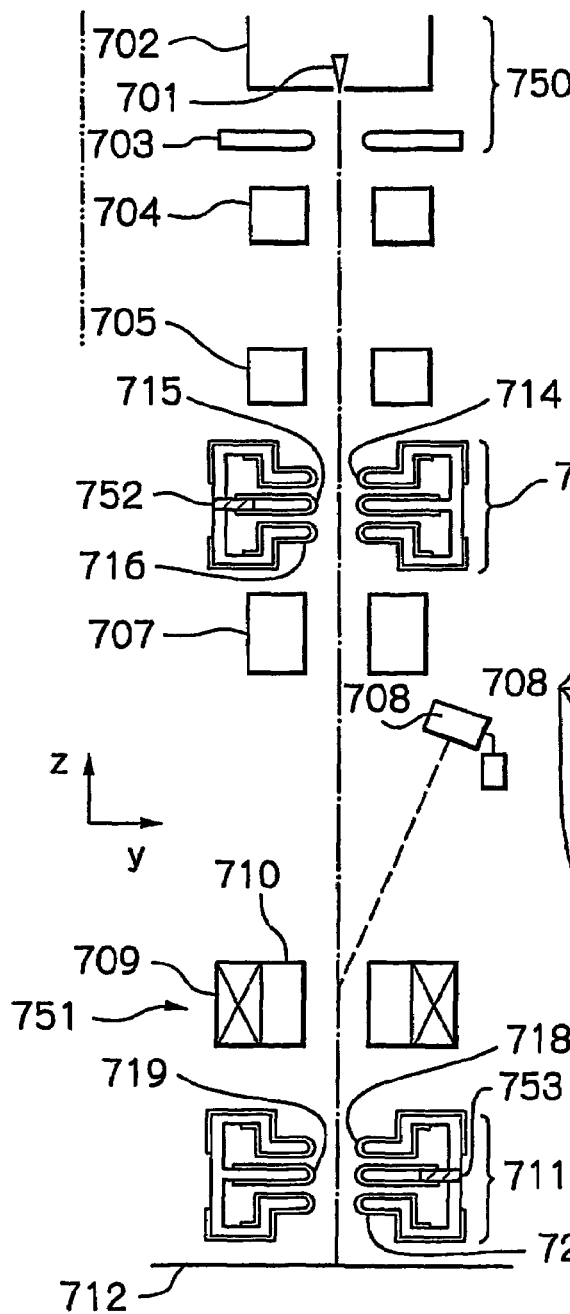
FIG. 8 is a schematic diagram showing a fourth embodiment of the present invention.
Figure 8:
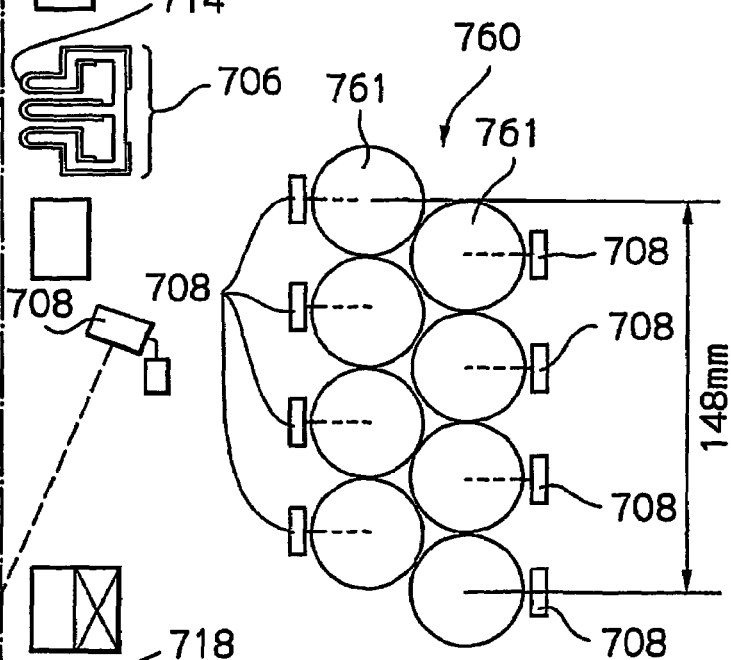

FIG. 8 (a) is a schematic diagram generally showing an electron beam apparatus according to a fourth embodiment of the present invention. As shown in FIG. 8 (b), the electron beam apparatus comprises a plurality of electronic optical lens barrels 760 each having the same configuration with others (eight barrels in the illustrated example) arranged in parallel over a sample 712. Each one lens barrel 761 of those electronic optical leans barrels 760 has an electron gun 750, axial aligning deflectors 704, 705 for carrying out an axial alignment of a primary electron beam, a condenser lens 706, an electrostatic deflector 707 for scanning operation of the primary electron beam, an ExB separator 751 composed of an electromagnetic deflector 709 and an electrostatic deflector 710, an objective lens 711, and a detector 708 of a detecting system for detecting a detection signal for either one of the secondary electron, a reflected electron or an absorbed electron emanated from the sample 712.

The electron gun 750 comprises a Wehnelt 702, a thermionic emission cathode 701 and an anode 703, and serves for emitting the primary electron beam to irradiate the sample 712. Said thermionic emission cathode 701 is made of single crystal of $LaB_6$. The primary electron beam emitted from the thermionic emission cathode 701 is axially aligned with respect to the condenser lens 706 by the axial aligning deflectors 704, 705 and then focused on the sample 712 by the condenser lens 706. The primary electron beam focused by the condenser lens 706 is formed into an image on the sample 712 by the objective lens 711. At the same time, the primary electron beam is deflected with the aid of the electrostatic deflector 707 and the electromagnetic deflector 709 of the ExB separator 751 so as to scan the surface of the sample 712. Since the angle of deflection by the electromagnetic deflector 709 has been set to be approximately two times of that by the electromagnetic deflector 707, there would be almost no chromatic aberration due to the deflection.

Either one of the secondary electron, the reflected electron or the absorbed electron emanated from the scanned point on the sample 712 is attracted and thus accelerated and focused by a high positive voltage applied to a central electrode 719 of the objective lens 711, and further separated by the ExB separator 715 from the primary optical system to be introduced into the secondary optical system and then finally formed into an image on the detector 708.

The detector 708 detects either of the secondary electron or the reflected electron each formed into an image, and outputs the electric signal representing the intensity thereof (i.e., the detection signal of either of the secondary electron or the reflected electron) to the image forming section, which is not shown. Said image forming section is further supplied with the scanning signal which has been given to the electrostatic deflector 707 and the electromagnetic deflector 709 for deflecting the primary electron beam. The image forming section synthesizes the scanning signal and the electric signal into the image data and thus can compose or display an image (SEM image) representing the scanned surface of the sample 712. This image data may be compared to the reference image data of the sample including no defective portion to detect any defects on the sample 712.

Further, as shown in FIG. 8, the condenser lens 706 is such a lens that is made of ceramic as a single insulating material, which has been processed to form a plurality of electrodes with a metal coating selectively applied to a surface thereof. The plurality of electrodes of the condenser lens 706 consists of an upper electrode 714, a central electrode 715 and a lower electrode 716, and the voltage is applied to the condenser lens 706 via a lead mounting bracket 752. Similarly to the condenser lens 706, the objective lens 711 is also such a lens that is made of ceramic as a single insulating material, which has been processed to form a plurality of electrodes with a metal coating selectively applied to a surface thereof. The plurality of electrodes of the objective lens 711 consists of an upper electrode 718, a central electrode 719 and a lower electrode 720, and the voltage is applied to the objective lens 711 via a lead mounting bracket 753. Since the condenser lens 706 and the objective lens 711, if processed in the above manner, can reduce their outer diameters and thus can achieve a reduced diameter of the electronic optical lens barrel 761, therefore a set of multi electronic optical lens barrels 761 arranged in parallel may be disposed over one piece of sample 712.

Figure 9:
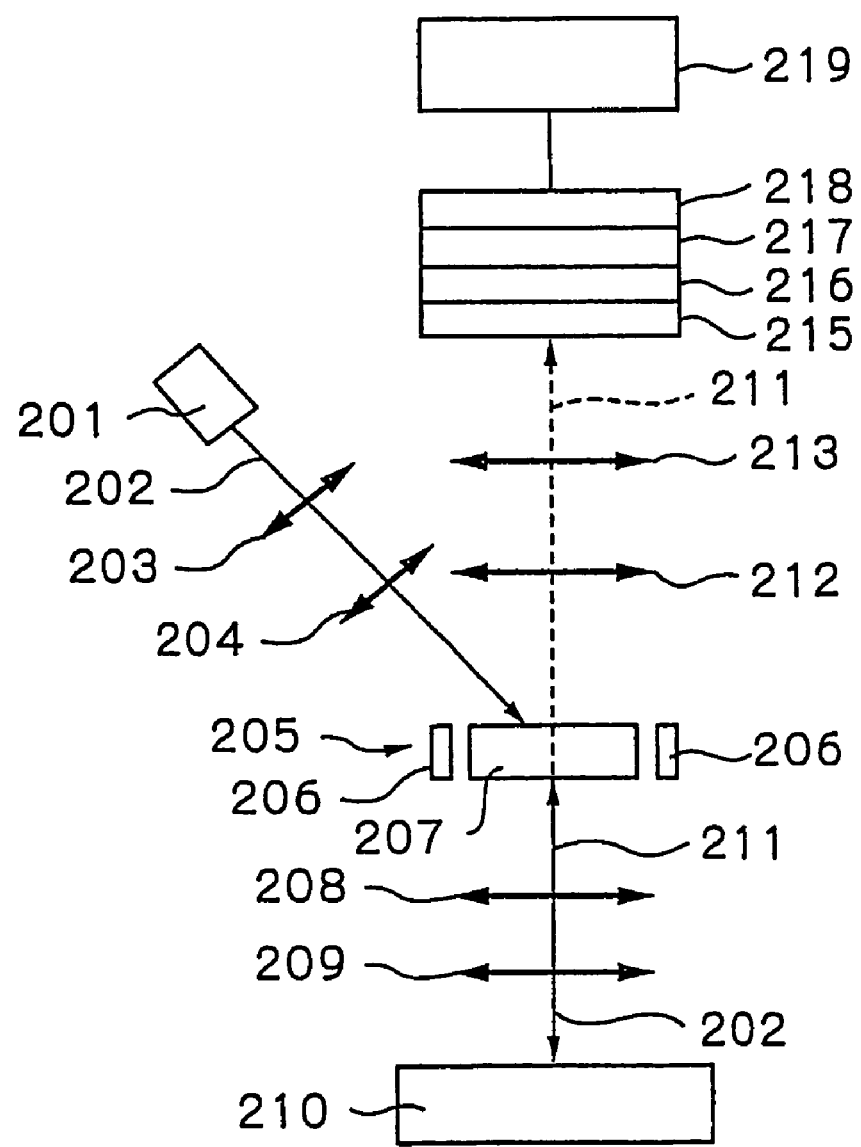
FIG. 9 is a schematic diagram showing a fifth embodiment of the present invention.

FIG. 9 is a schematic diagram illustrating a fifth embodiment of the present invention. This represents an example using an electron beam inspection apparatus of the map projection type as the electron beam defect inspection apparatus. A primary electron beam 202 emitted from an electron gun 201 is shaped properly through a rectangular aperture and formed into a rectangular image of 0.5 mm×0.125 mm on a central area of a deflection plane of an E×B filter 205 by a two-step of lenses 203 and 204. This E×B filter 205 is also referred to as a Wien filter, and has an electrode 206 and a magnet 207 so as to form an electric field and a magnetic field crossing each other at a right angle, thereby providing a function for deflecting the primary electron beam 202 by the angle of 35 degrees toward the sample (in the direction normal to the sample) while permitting the secondary electron beam from the sample to pass straight ahead. The primary electron beam 202 deflected by the E×B filter 205 is demagnified by lenses 208, 209 to 2/5 and projected on a sample 210. The secondary electrons or the reflected electrons 211 having the information on the pattern image and emanated from the sample 210 are magnified by the lenses 209, 208, then advanced through the E×B filter 205 straight forward, magnified by lenses 212, 213, intensified by ten thousand times in a MCP (Micro-Channel Plate) 215 and converted into the light by a fluorescence section 216, and that light passes through a relay optical system 217 and is turned into electric signals synchronized with the moving rate of the sample in a TDI-CCD 218, which signals are obtained as a series of images in an image display section 219. Further, said image is compared on time to a plurality of cell images or to a plurality of die images, thereby detecting any defective conditions on a surface of a sample (e.g., a wafer). In addition, a feature such as the shape, a position coordinate and a number of the detected defective portions may be recorded and output to a CRT or the like. On the other hand, appropriate condition is chosen for individual sample substrate depending on the difference in the surface structure, such as an existence of an oxide film or a nitride film, or depending on the difference in the process having applied previously to the sample substrate, and then the electron beam is irradiated according to the chosen condition so that after the irradiation having been carried out under the optimal irradiating condition, the image from the electron beam may be obtained so as to detect any defective portions. The fluorescence section 216, the relay optical system 217 and the TDI-CCD 218 may be replaced with an EB-TDI. In that case, the MCP 215 may be eliminated. A transmission electron may be detected in place of the secondary electron or the reflected electron. In that case, since the primary optical system and the secondary optical system are arranged so as to face to each other along a straight line with the sample placed therebetween, the E×B filter can be eliminated thereby increasing the resolution of the whole system.

Although in the above embodiment, the configuration having only one set of combination of the primary electron beam and the detecting electron lens barrel has been described as an example, two or more lens barrels may be arranged to form two or more combinations of the primary electron beams and the detecting electron lens barrels thus to increase the inspection rate.

Figure 10:
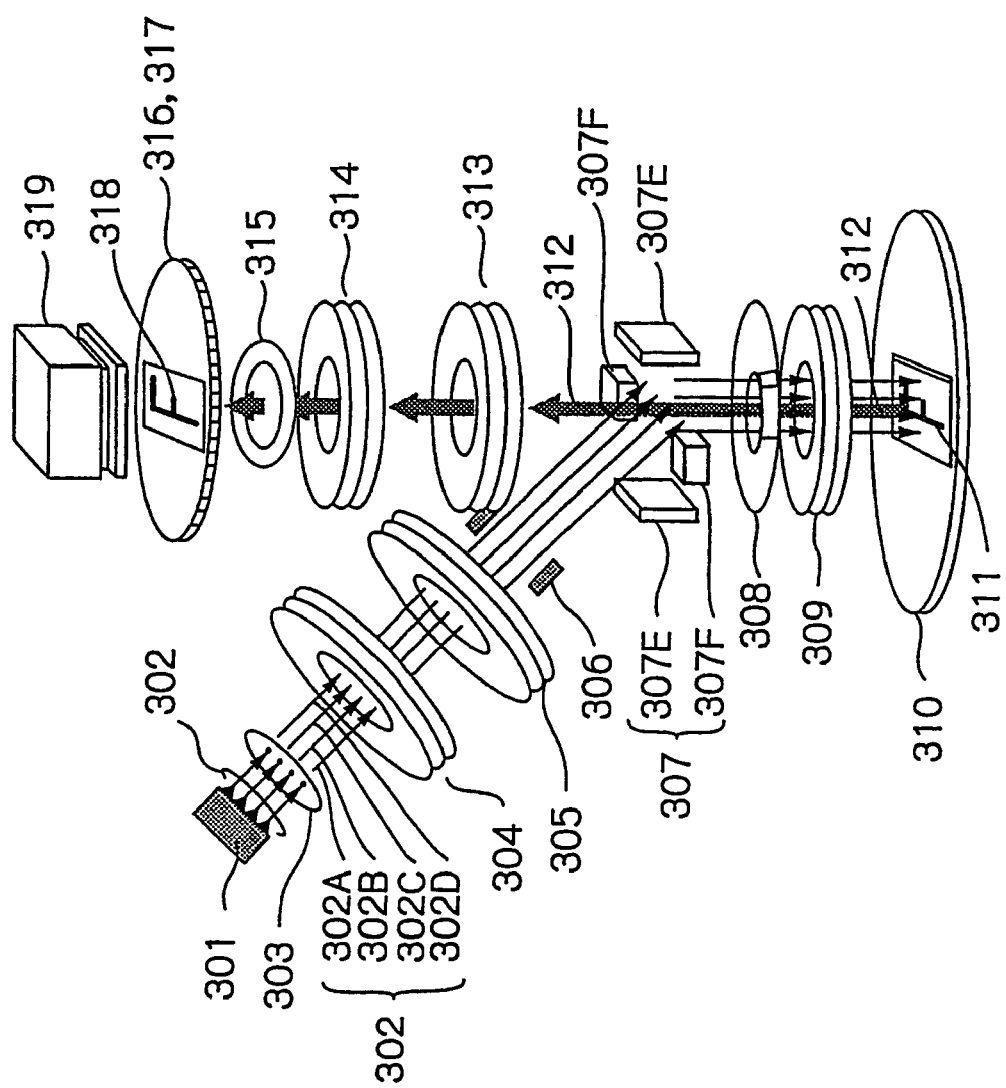
FIG. 10 is a schematic diagram showing a sixth embodiment of the present invention.

FIG. 10 is a schematic diagram showing a general configuration of an apparatus according to a sixth embodiment of the present invention. Four of primary electron beams 302 (302A, 302B, 302C and 302D) emitted from an electron gun 1 are shaped properly through an aperture stop 303 and formed into an elliptical image of 10 μm×12 μm on a central area of a deflection plane of an E×B filter 307 by a two-step of lenses 304 and 305, in which the electron beams are controlled by a deflector 306 so as to make a raster scanning along the direction normal to this drawing sheet so that the irradiation can cover uniformly a rectangular area of 1 mm×0.25 mm as a whole. The four primary electron beams 302 deflected by the E×B filter 307 then form a crossover at an NA aperture 308, and then the primary electron beams are further reduced to 1/5 by a lens 309 and irradiated/projected onto a sample (e.g., a wafer) 310 in the approximately normal direction with respect thereto so as to cover an area of 200 μm×50 μm thereof. Four of secondary electron beams 312 having information on a pattern image (a sample image 311) and emanated from the sample 310 are magnified through lenses 309, 313 and 314, and a magnetic lens 315 makes an angle correction between the direction of the sample successive movement and the direction of integrated row number of a TDI-CCD 319, and thereafter the four secondary electron beams 312 are synthesized together so as to be formed into a rectangular image (a magnified projection image 318) as a whole on an MCP 316. This magnified projection image 318 is intensified by ten thousand times by the MCP 316, converted into the light by a fluorescence section 317 and turned to be electric signals synchronized with the successive moving rate of the sample in the TDI-CCD 319, which signals are obtained as a series of images in an image display section (not shown) and then output to a CRT or the like, or stored in a memory device. A defective portion can be detected from this image by further carrying out a cell comparison or a die comparison, and a position coordinate, a size or a type of the detected defective portion is determined and then accordingly stored, indicated and/or output.

Figure 11:
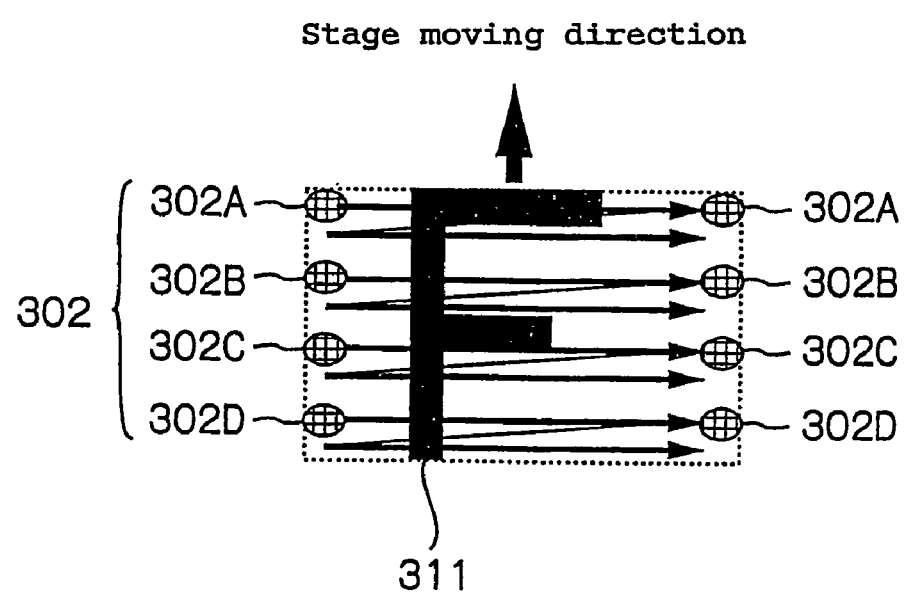
FIG. 11 is a schematic diagram illustrating an electron beam irradiating method of FIG. 10.

FIG. 11 shows an irradiating method of primary electron beam according to the present embodiment. The primary electron beam 302 is composed of four electron beams 302A, 302B, 302C and 302D, each of them being in an elliptical shape of 10 μm×12 μm. Each of those electron beams raster-scans a rectangular area of 200 μm×12.5 μm, meaning that the four electron beams added together without any overlaps therebetween can irradiate a total rectangular area of 200 μm×50 μm. In this embodiment, an uneven irradiation of the primary electron beams is about ±3%, and an irradiation current per each electron beam is 250 nA, so that a total of 1.0 μA could be successfully obtained using four electron beams on the surface of the sample as a whole. The current can be increased further by using more electron beams and thereby a higher throughput can be obtained.

Although not shown in the drawing, the present apparatus further comprises, in addition to the lenses, those units required for illuminating and focusing of the electron beam, including a field aperture, a deflector (i.e., an aligner) having four or more electrodes for axial tuning of the electron beam, an astigmatism corrector (a stigmeter) and a plurality of quadrupole lenses (four-pole lenses) for properly shaping the beam shape.

The electron beam irradiating section is required to control the electron beam to irradiate the surface of the sample as uniformly as possible, while reducing uneven irradiation, in a rectangular or an elliptical shape, and further required to make an irradiation against the region to be irradiated with the electron beam having a much higher current in order to increase the throughput. In an electron beam irradiating system according to the prior art, the unevenness in irradiation has been in a range of ±10% and the irradiating current has been about 500 nA in the irradiated region. Further disadvantageously, the prior art system is associated with a problem that a fault in image formation is apt to occur due to a charge up as compared to the scanning type electron microscope (SEM) system because a large image observation region is irradiated once in block with the electron beam, but the method according to the present invention, in which a plurality of electron beams is used to scan and thus irradiate the sample, has successfully reduced the unevenness in irradiation to nearly ⅓. Advantageously, the current value of two times or more as compared to the irradiation current according to the prior art system has been obtained with total of four electron beams on the surface of the sample as a whole. By increasing the number of employed electron beams, for example, up to 16 beams, which will be easily achieved, the current should be much higher and accordingly much higher throughput may be obtained. Further, by using a relatively narrow beam for raster-scanning, it becomes easier for the charges to escape from the surface of the sample, so that the charge up could be reduced successfully to ¹/₁₀ or lower as compared to the irradiation in the block.

Although in the above embodiment, the configuration in which the electron beam defect inspection apparatus of the projection type has only one set of combination of the primary electron beam and the detecting electron lens barrel has been described as an example, two or more lens barrels may be arranged to form two or more combinations of the primary electron beams and the detecting electron lens barrels.

An exemplary embodiment of a method for manufacturing a semiconductor device according to the present invention will now be described.

Figure 12:
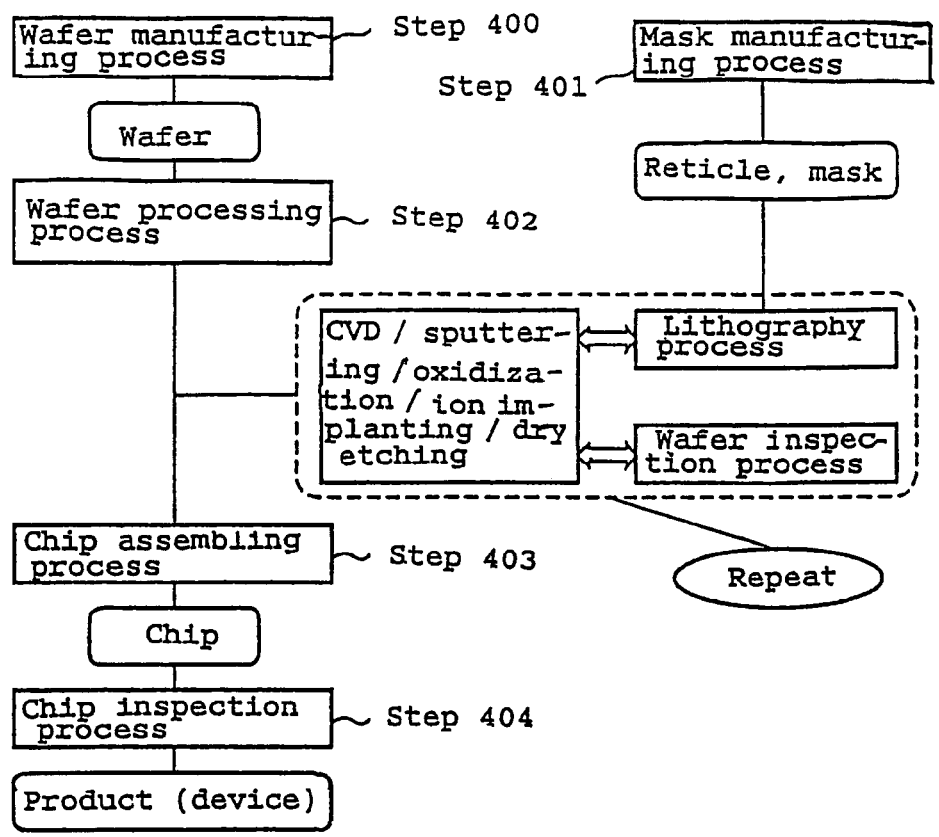
FIG. 12 is a flow chart of a device manufacturing process.

FIG. 12 is a flow chart showing an example of the semiconductor device manufacturing method according to the present invention. The manufacturing process of this example includes the following main processes.

(1) A wafer manufacturing process for manufacturing a wafer (or wafer preparing process for preparing a wafer) 400.

(2) A mask manufacturing process (or a mask preparing process) 401 for fabricating a mask to be used in the exposure.

(3) A wafer processing process 402 for performing any processing treatments necessary for the wafer.

(4) A chip assembling process 403 for cutting out those chips formed on the wafer one by one to make them operative.

(5) A chip inspection process 404 for inspecting an assembled chip.

It is to be appreciated that each of those processes further comprises several sub-processes.

Among those main processes, the principal process that gives a critical affection to the performance of the semiconductor device is the wafer processing process. In this process, the designed circuit patterns are stacked on the wafer one on another, thus to form many chips, which will function as memories or MPUs. This wafer processing process includes the following sub-processes.

(1) A thin film deposition process for forming a dielectric thin film to be used as an insulation layer and/or a metallic thin film to be formed into a wiring section or an electrode section, or the like (by using the CVD or the sputtering).

(2) An oxidizing process for oxidizing the formed thin film and/or the wafer substrate.

(3) A lithography process for forming a pattern of the resist by using a mask (reticle) in order to selectively process the thin film layer and/or the wafer substrate.

(4) An etching process for processing the thin film layer and/or the wafer substrate in accordance with the pattern of the resist (by using, for example, the dry etching technology).

(5) An ions/impurities implant and diffusion process.

(6) A resist stripping process.

(7) An inspection process for inspecting the processed wafer.

It should be noted that the wafer processing process must be performed repeatedly as desired depending on the number of layers contained in the wafer, thus to manufacture the device that will be able to operate as designed.

Figure 13:
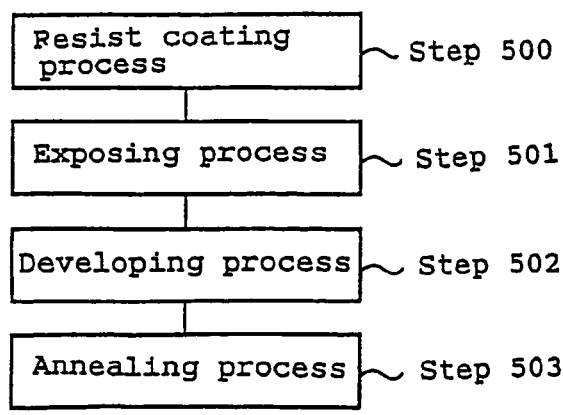
FIG. 13 is a flow chart of the lithography process.

FIG. 13 is a flow chart showing the lithography process included as a core process in said wafer processing process of FIG. 12. This lithography process comprises the respective processes as described below.

(1) A resist coating process 500 for coating the wafer having a circuit pattern formed thereon in the preceding stage with the resist.

(2) An exposing process 501 for exposing the resist;

(3) A developing process 502 for developing the exposed resist to obtain the pattern of the resist.

(4) An annealing process 503 for stabilizing the developed resist pattern.

All of the semiconductor device manufacturing process, the wafer processing process, and the lithography process described above have been well known and no additional explanation should be necessary.

When the defect inspection method and the defect inspection apparatus according to the present invention are applied to the wafer inspection process (7) described above, even such a semiconductor device having a fine pattern can be evaluated with high throughput, which allows a 100% inspection to be achieved as well as the yield of the products to be improved, while prohibiting any defective products from being delivered.

The present invention provides an integrated apparatus having a configuration in which a defect inspection apparatus has been incorporated in a semiconductor manufacturing apparatus such as a CMP unit, whereby the present invention has achieved the reduction of the loading, the unloading and the wafer transferring steps to ⅔, thereby reducing 10% of the CMP process and the inspection time as well as 20% of the area required for installing the apparatus, as compared to the prior art. Further, the present invention has succeeded to reduce the cost for manufacturing the apparatus by 15%.

The invention claimed is:

1. A method for operating a semiconductor manufacturing apparatus comprising a CMP (Chemical and Mechanical Polishing) section, a cleaning section, a drying section, an inspecting section, a loading section and an unloading section, said method comprising the step of selecting any of first, second and third operation modes, wherein:

said first operation mode consists of a sample loading step of taking out a sample such as a wafer from a cassette at said loading section and inserting the sample into said CMP section, a CMP step of planarizing the sample at said CMP section, a cleaning step of cleaning the planarized sample at said cleaning section, a drying step of drying the cleaned sample at said drying section, an inspecting step of inspecting the dried sample at said inspecting section and a sample unloading step of moving the inspected sample into the cassette at said unloading section;

said second operation mode consists of said sample loading step, said CMP step, said cleaning step, said drying step and a sample unloading step of moving the dried sample into the cassette at said unloading section; and said third operation mode consists of a sample loading step of taking out a sample such as a wafer from a cassette at said loading section and inserting the sample into said inspecting section, an inspecting step of inspecting the sample at said inspecting section and said sample unloading step.

2. A method for operating a semiconductor manufacturing apparatus according to claim 1, in which: said inspecting step is performed by a defect inspection apparatus using an energy particle beam; said defect inspection apparatus comprises an energy particle irradiating section, an energy particle detecting section, an information processing section, an X-Y stage and a sample carrier table; and said defect inspection apparatus is integrated with said semiconductor manufacturing apparatus.

3. A method for operating a semiconductor manufacturing apparatus according to claim 2, in which: said inspecting section is disposed in the vicinity of at least one of said CMP section, said drying section and said unloading section.

4. A method for operating a semiconductor manufacturing apparatus according to claim 2, in which: said defect inspection apparatus is an electron beam defect inspection apparatus.

5. A method for operating a semiconductor manufacturing apparatus according to claim 4, in which: said defect inspection apparatus comprises a differential pumping system; and an electron beam irradiated region on a surface of the sample is decompressed by said differential pumping system.

6. A method for operating a semiconductor manufacturing apparatus according to claim 4, in which: said defect inspection apparatus is an electron beam defect inspection apparatus of a scanning electron microscope (SEM) system.

7. A method for operating a semiconductor manufacturing apparatus according to claim 6, in which: a primary electron beam used in said electron beam defect inspection apparatus is composed of a plurality of electron beams; and secondary electrons from the sample are deflected from an optical axis of the primary electron beam by an E×B filter (Wien filter) and detected by a plurality of electron beam detectors.

8. A method for operating a semiconductor manufacturing apparatus according to claim 4, in which: said defect inspection apparatus is an electron beam defect inspection apparatus of the projection type electron microscope system.

9. A method for operating a semiconductor manufacturing apparatus according to claim 8, in which: a primary electron beam used in said electron beam defect inspection apparatus is composed of a plurality of electron beams; said plurality of electron beams are irradiated against the sample while scanning the sample; and electrons from the sample are deflected from an optical axis of the primary electron beam by an E×B filter (Wien filter) and detected by a two-dimensional or line image sensor.

* * * * *